US010193546B1

(12) United States Patent
Long

(10) Patent No.: US 10,193,546 B1
(45) Date of Patent: Jan. 29, 2019

(54) PUMP SWITCHING DEVICE

(71) Applicant: S. J. ELECTRO SYSTEMS, INC., Detroit Lakes, MN (US)

(72) Inventor: David N. Long, Detroit Lakes, MN (US)

(73) Assignee: S.J. Electro Systems, Inc., Detroit Lakes, MN (US)

(*) Notice: Subject to any disclaimer, the term of this patent is extended or adjusted under 35 U.S.C. 154(b) by 328 days.

(21) Appl. No.: 15/004,488

(22) Filed: Jan. 22, 2016

Related U.S. Application Data

(60) Provisional application No. 62/107,009, filed on Jan. 23, 2015.

(51) Int. Cl.

| | |
|---|---|
| ***F04B 49/04*** | (2006.01) |
| ***H01H 47/22*** | (2006.01) |
| ***H03K 17/28*** | (2006.01) |
| ***F04B 49/025*** | (2006.01) |
| ***H03K 17/567*** | (2006.01) |

(52) U.S. Cl.
CPC ......... *H03K 17/567* (2013.01); *F04B 49/025* (2013.01); *F04B 49/04* (2013.01); *H01H 47/22* (2013.01); *H03K 17/28* (2013.01)

(58) Field of Classification Search
CPC ........ F04B 49/04; F04B 49/025; F04B 49/02; H03K 17/567; H03K 17/28; H01H 47/22
USPC ............................................... 417/36, 40, 41
See application file for complete search history.

(56) References Cited

U.S. PATENT DOCUMENTS

| | | | | |
|---|---|---|---|---|
| 3,667,022 | A * | 5/1972 | Quinn | G05D 9/12 318/482 |
| 5,449,274 | A * | 9/1995 | Kochan, Jr. | F04D 15/0218 417/12 |
| 5,851,108 | A * | 12/1998 | Clymer | B67D 7/3218 417/44.1 |
| 6,140,925 | A * | 10/2000 | Lee | G01F 23/74 340/618 |
| 7,110,225 | B1 * | 9/2006 | Hick | H01H 9/542 361/8 |
| 7,704,050 | B2 * | 4/2010 | Marioni | F04D 15/0218 417/36 |
| 8,591,198 | B2 * | 11/2013 | Kochan, Jr. | G01F 23/18 200/81 R |

* cited by examiner

*Primary Examiner* — Philip E Stimpert
(74) *Attorney, Agent, or Firm* — Dicke, Billig & Czaja, PLLC

(57) ABSTRACT

A pump switching device is provided. The pump switching device includes a relay, a switch, a sensor and a controller. The relay selectively couples current to a pump motor. The switch is coupled in parallel with the relay. The sensor is configured to generate a signal upon the detection of a condition. The controller is in communication with the sensor. The controller is further coupled to control the relay and the switch. The controller is configured to activate the switch a select amount of time before the controller activates the relay upon initial detection of the signal from the sensor. The controller is further configured to deactivate the switch a select amount of time after the relay is activated while the signal is being detected.

8 Claims, 6 Drawing Sheets

PUMP SWITCHING DEVICE

CROSS-REFERENCE TO RELATED APPLICATIONS

This Application claims priority to U.S. Provisional Application Ser. No. 62/107,009, same title herewith, filed on Jan. 23, 2015, which is incorporated in its entirety herein by reference.

BACKGROUND

Sump pumps are typically used to pump unwanted fluids out of a location. Sump pump systems implement pump switching devices to activate and deactivate the pump as needed. Typical pump switching devices use sensing methods such as floatation based switches with tethered electrical cords, floats guided by rods, or orienting devices to indicate when to activate and deactivate the pump.

Many of the switching devices that are actuated by vertically moving floats are limited in longevity and durability due to mechanical breakdown of the actuating components. An inherent problem with tethered switches is that they must pivot at a tether point. In order to increase the pumping differential, the tethered cord length must be increased, which makes the system prone to entanglement or hang-up in close spaces. In addition, because of dirt, grit, and debris in the environment to which the sump pump system is typically exposed, other types of switching devices, such as but not limited to, capacitive, optical, or pressure based sensing switches, are often prone to inoperability due to fouling on the surface of the device. Moreover, another limiting factor for many of the typical solid state electronic switches used in pump switching devices is that solid state switches experience significant heat build-up. If the heat is not dissipated, it can result in the pump switching device failing to operate properly.

For the reasons stated above and for other reasons stated below which will become apparent to those skilled in the art upon reading and understanding the present specification, there is a need in the art for an improved and effective pump switching configuration for sump pumps and similar systems.

SUMMARY OF INVENTION

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, a pump switching device is provided. The pump switching device includes a relay, a switch, a sensor, and a controller. The relay selectively couples current to a pump motor. The switch is coupled in parallel with the relay. The sensor is configured to generate a signal upon the detection of a condition. The controller is in communication with the sensor. The controller is further coupled to control the relay and the switch. The controller is configured to activate the switch a select amount of time before the controller activates the relay upon initial detection of the signal from the sensor. The controller is further configured to deactivate the switch a select amount of time after the relay is activated while the signal is being detected.

In another embodiment, a method of operating a pump switch is provided. The method includes activating a switch to provide current to a motor upon detection of an upper fluid level detect signal. A relay that is coupled in parallel with the switch is activated after a select period of time has passed since the activation of the switch. The switch is then deactivated after a select amount of time has passed since the activation of the relay. Once the upper fluid level detect signal is no longer detected, the switch is reactivated. The relay is then deactivated after a select amount of time has passed since the reactivation of the switch. Finally, the switch is deactivated after a select amount of time has passed since the deactivation of the relay.

In still another embodiment, another pump switching device is provided. The pump switching device includes a relay, a switch, a Hall effect sensor, a magnet, a controller, and a float. The relay selectively couples current to a pump motor. The switch is coupled in parallel with the relay. The Hall effect sensor is configured to generate a signal upon the detection of a magnetic field. The magnet is used to generate the magnetic field. The controller is in communication with the sensor. The controller is further coupled to control the relay and the switch. The float is configured and arranged to interact with a fluid to be pumped by the pump motor. The float is operationally coupled to the magnet.

BRIEF DESCRIPTION OF THE DRAWINGS

The present invention can be more easily understood and further advantages and uses thereof will be more readily apparent, when considered in view of the detailed description and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

Embodiments of the present invention provide a pump system with a pump switching device that is designed to be efficient, robust, and long lasting. In one embodiment, the device utilizes a solid state sensor and switch in combination with a mechanical relay to operate a pump with a high degree of electronic reliability. This configuration is less susceptible to mechanical wear. Embodiments of the pump switching device also produce minimal heat generation thus extending the life of the pump switching device over existing mechanical or electronic actuating devices. Moreover, in one embodiment, the solid state sensor is a Hall effect sensor. A Hall effect sensor is not subject to a fouling layer on the surface of the float or housing and is not prone to mechanical wear. Moreover, in one embodiment, the solid state switch includes a triac. A triac is a three terminal component that conducts current in either direction when triggered.

Figure 1:
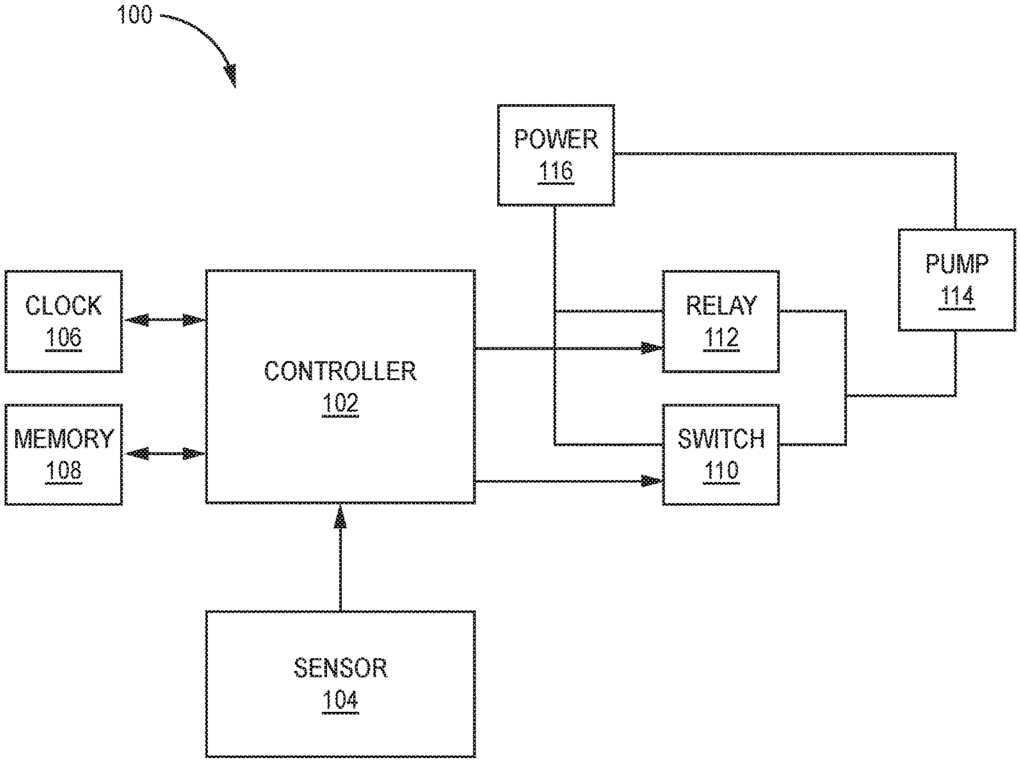
FIG. 1 is a block diagram illustrating a pump switching device of one embodiment of the present invention.

Referring to FIG. 1, a block diagram of pump switching device 100 of one embodiment of the present invention is illustrated. The pump switching device 100 in this embodiment includes a controller 102. The controller 102 includes a processor that implements instructions stored in a memory 108. The pump switching device further includes a clock 106 that the controller 102 uses in implementing the instructions stored in the memory 108. The controller 102 is in communication with at least one sensor 104. The sensor 104 is designed to generate an upper fluid level detect signal when a select level of the fluid (or liquid) is detected. The controller 102 is configured to detect the upper fluid level detect signal generated by the sensor 104. In one embodiment, a Hall effect sensor is used as sensor 104 as is discussed in detail below. However, the use of other types of sensors, such as but not limited to tilt switches, are contemplated in other embodiments. The pump switching device 100 further includes a switch 110. The switch 110 is coupled to a power source 116. In one embodiment the switch is a solid state switch 110. Moreover, in one embodiment, the switch includes a triac. The controller 102 is in communication with the switch 110 to control operations of the switch 110. A relay 112 is coupled in parallel with the switch 110. As discussed above, in one embodiment, the relay 112 is a mechanical relay 112, however, the use of a solid state relay is contemplated in other embodiments. The relay is designed to selectively couple operational current from the power source 116 to pump 114. The controller 102 is also in communication with the relay 112 to control operations of the relay 112.

One factor that can cause early failure of the pump switching device 100 is electro-ablation on the relay contacts caused by arcing when the relay 112 is initially turned on and off. Arcing occurs on the contacts as the result of current or voltage transients when the relay is initially turned on and off. Current or voltage transients at the initial turn on and off of the relay are in turn the result of a sudden inrush of current during turn on and the collapse of the electrical field during turn off. As discussed above, the switch 110 is coupled in parallel with the relay 112. In embodiments, the switch 110 is activated before the relay 112 is activated, deactivated once the relay 112 has been activated, reactivated before the relay 112 is to be deactivated, and then deactivated after the relay 112 has been deactivated as is discussed in detail below. This prevents arcing from occurring at the mechanical contacts of the relay 112. Moreover, since switch 110 is a solid state switch it does not have mechanical contacts. In addition, solid state switch 110 only "turns on" and "turns off" at the zero crossing of the voltage sinusoid (AC voltage). Hence, the voltage is zero at the point the switch 110 starts and stops current conduction so no arcing is created. In embodiments, the pump 114 starts as soon as switch 110 is activated and stays on until switch 110 is deactivated at the end of the cycle.

Figure 2:
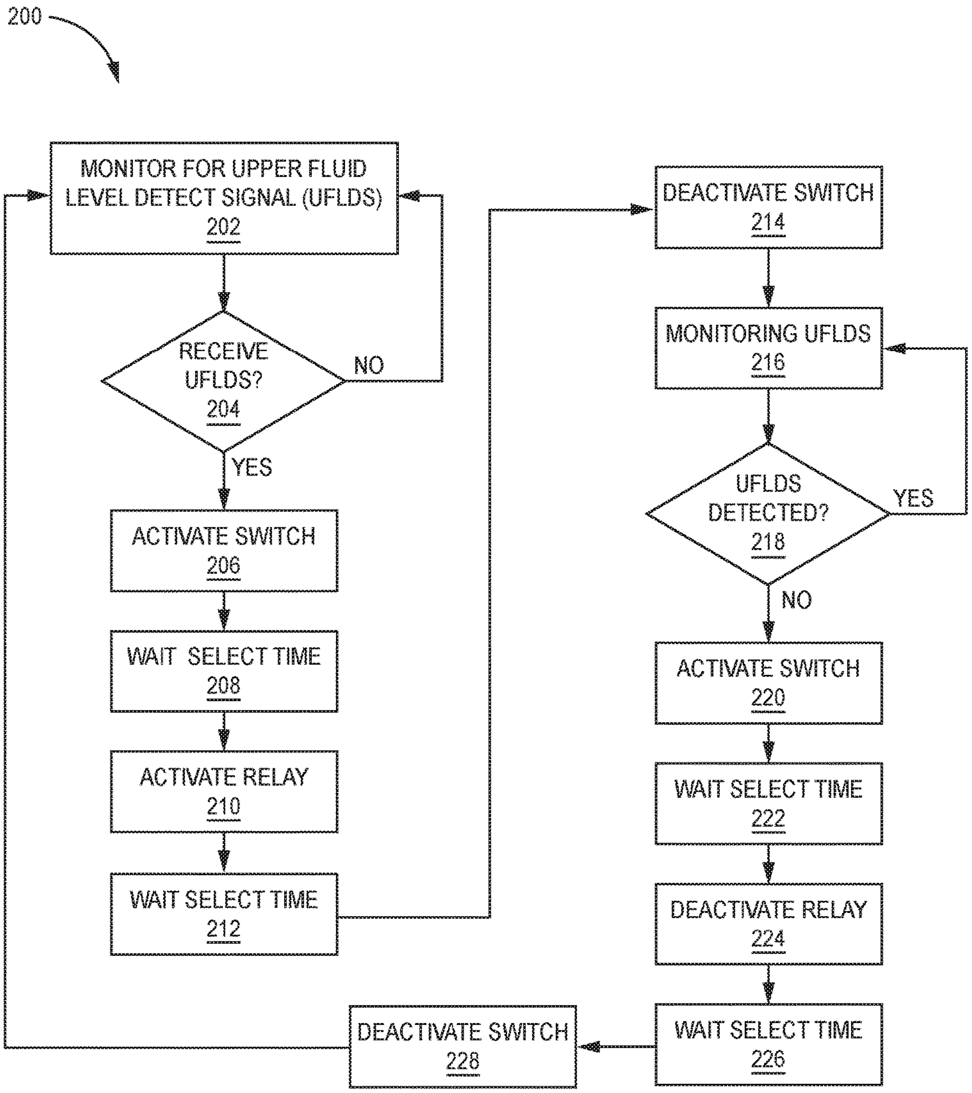
FIG. 2 is an operational flow diagram of the pump switching device of FIG. 1 of one embedment of the present invention.

FIG. 2 illustrates an operational flow diagram 200 of the pump switching device 100. The controller 102 monitors for the upper fluid level detect signal from the sensor 104 at (202). If no upper fluid level detect signal is detected at (204), the controller 102 continues to monitor at (202). If an upper fluid level detect signal is detected at (204), the controller activates (turns on) the switch 110 at (206) which activate the pump 114. The controller 102 then waits a select amount of time, for example, one second at (208). Once the controller has waited the select amount of time at (208), the controller then activates relay 112 at (210). After activation of the relay 112, the controller 102 then again waits for a select amount of time at (212), for example, one second, and then deactivates (turns off) the switch 210 at (214). Turning the switch 110 off stops the switch from generating heat which in turn extends the life of the pump switching device 100. The process continues with the controller 102 monitoring the upper fluid level detect signal at (216). Once the upper fluid level detect signal is no longer detected by the controller 102 at (218), the controller 102 once again activates (turns on) switch 110 at (220). After a select amount of time has passed at (222), the relay 112 is deactivated at (224). Further, after a select amount of time has passed since the relay 112 has been deactivated, the controller 102 deactivates (turns off) the switch 110 which deactivates the pump 114 and the cycle is complete. The process continues at (202) with the controller monitoring for the upper fluid level detect signal.

Figure 3:
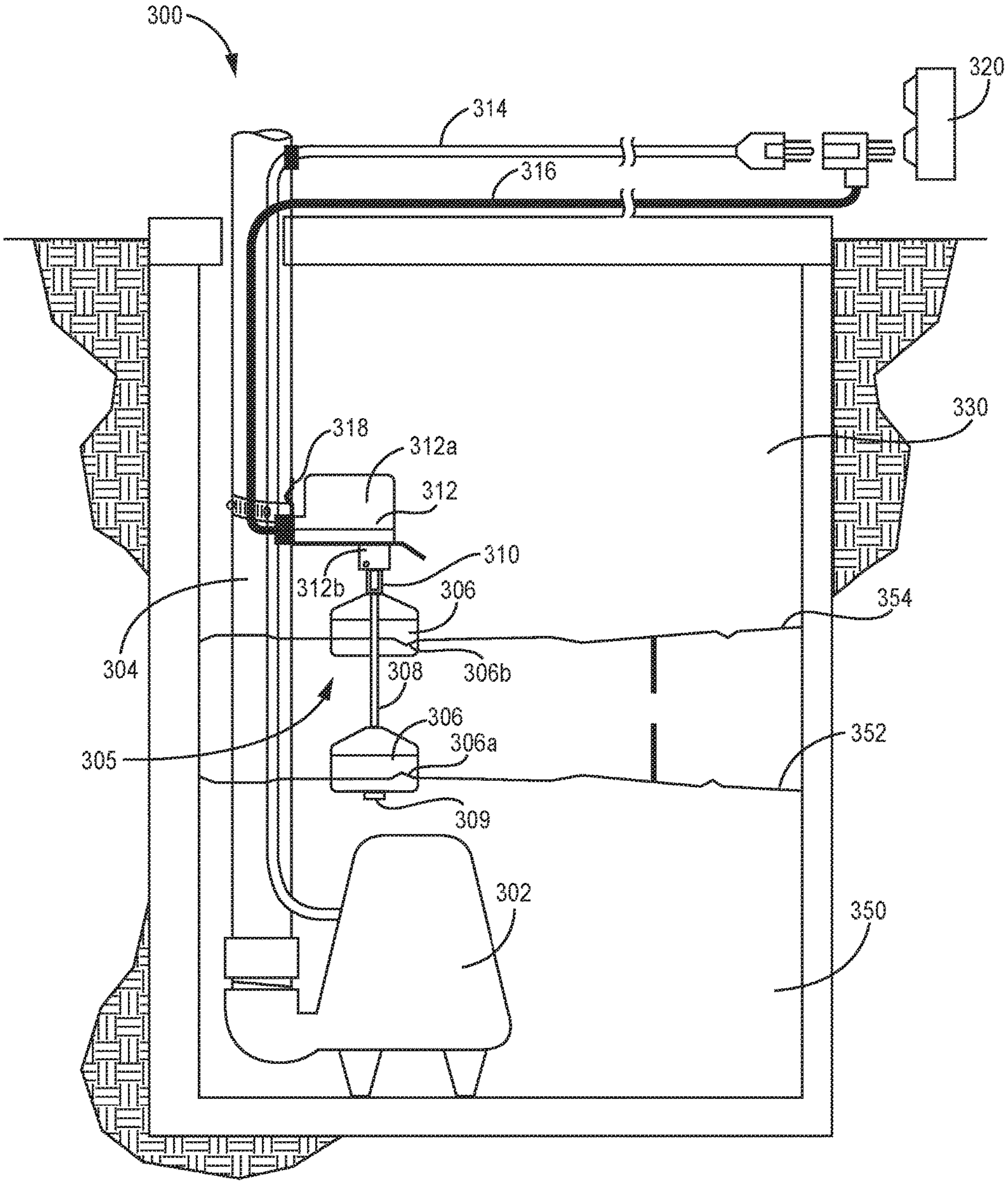
FIG. 3 is a side view of a pump system implementing a pump switching device of one embodiment of the present invention.

Referring to FIG. 3, a side view of a pump system 300 that implements the pump switching device 100 described above is illustrated. The pump system 300 is illustrated as being placed in a chamber 330 that contains a fluid 350. The pump system 300 includes a pump 302 which in this embodiment is a sump pump. The pump system 300 includes a discharge tube 304 that is in fluid communication with the pump 302. The discharge tube 304 is used to discharge the fluid 350 pumped by the pump 302. A power source 320 is in electrical contact with the pump 302 via power cord 314. The pump system 300 further includes a control housing 312. The control housing 312 houses components of the pump switching device 100. The control housing 312 in this embodiment includes an upper portion 312*a* and a lower portion 312*b*. Power is provided to the pump switching device 100 within the control housing 312 by a power cord 316 that is electrically connected to the power source 320. Slidably coupled to the lower portion 312*b* of the control housing 312 is an activation assembly 305. The activation assembly 305, in this embodiment, includes a float rod 308, a float rod head 309, an activation member 310, and a float 306. In particular, the float rod head 309 is coupled to a first end of the float rod 308 and the activation member 310 is coupled to a second end of the float rod 308. The float 306 includes a central passage (not shown). The float rod 308 is received within the central passage of the float 306 such that the float 306 can slidably move along a length of the float rod 308. The central passage of the float 306 has a smaller diameter than a diameter of the float rod head 309 and a diameter of activation member 310 such that the float 306 is retained along a length of the float rod 308. FIG. 3 further illustrates a first fluid level 352 and a second fluid level 354. As illustrated, the float 306 is at position 306*a* at the first fluid level 352 and the float 306 is at a position 306*b* at the second fluid level 354. It is understood that the position of the float 306 moves between position 306*a* and position 306*b* based on the level of fluid. Hence, the float 306 moves along the length of the float rod 308 as the fluid level changes.

Figure 4:
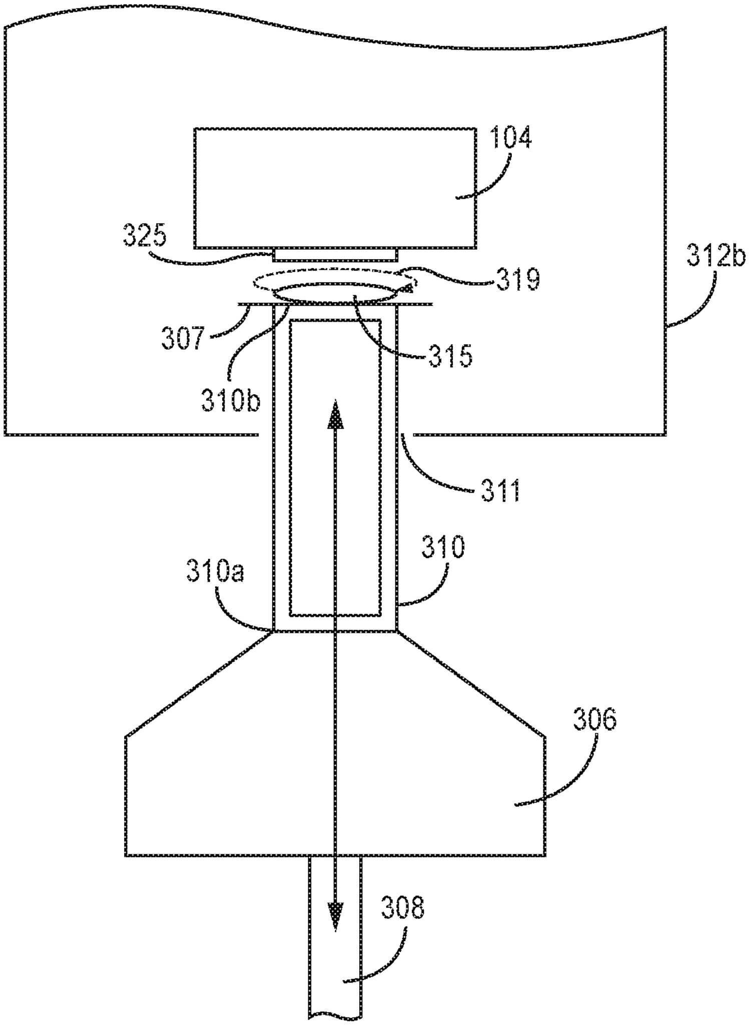
FIG. 4 is a close up partial side view of a portion of the pump switching device of FIG. 3 of one embodiment of the present invention.

A close up view of a portion of the pump switching device 100 and activation assembly 305 is illustrated in FIG. 4. In this embodiment, when the fluid level rises, the float sliding along the length of float rod 308 eventually engages the activation member 310. As discussed above, the activation member 310 has a diameter that is larger that the central passage of the float 306. Hence, when the float 306 engages the activation member 310, it asserts an upward force on the activation member 310. As the fluid level rises, the force on the activation member 310 becomes greater until there is enough force to move the activation member 310 farther into the lower portion 312*b* of the control housing 312 toward the sensor 104. In this example embodiment, a magnet 315 having a magnetic field 319 is coupled proximate an end of the activation member 310. The sensor 104, in this embodiment of the pump switching device 100, is a Hall effect sensor. The Hall effect sensor 104 generates the upper fluid level detect signal once the magnetic field 319 of the magnet 315 is close enough for the Hall effect sensor 104 to detect the magnetic field. In one embodiment, the Hall effect sensor 104 will continue to generate the upper fluid level detect signal as long as the magnetic field of the magnet 315 is detected. Moreover, in one embodiment a metal plate 325 is coupled near the Hall effect sensor 104. The metal plate 325 works as a latch to hold the magnet 315 (via magnetic attraction) close to the Hall effect sensor until the fluid level has been reduced to a predetermined lower level. Once the predetermined lower level 352 of the fluid 350 is reached, the magnetic attachment is broken and the magnet 315 is moved away from the Hall effect sensor 104. Once the Hall effect sensor no longer senses the magnetic field 319, the Hall effect sensor stops generating the upper fluid level detect signal. In this embodiment, the magnetic attachment is broken by the weight of the float 306 on the float rod head 309 of the float rod 308 as a result of the fluid level 350 drop. In this example embodiment, a retaining lip 307 on the activation member 310 that has a diameter that is larger than a diameter of an access aperture 311 in the lower portion 312*b* of the housing 312 retains a connection between the activation assembly 305 and the control housing 312 when the fluid level 350 is low. The above described method of implementing an activation assembly 305 with a Hall effect sensor 104 is just one example of an activation assembly 305 for a pump switching device 100. Other activation assemblies are contemplated, such as but not limited to, tilt switch activation assemblies as discussed below, pressure switch activation assemblies, and the like.

Figure 5A:
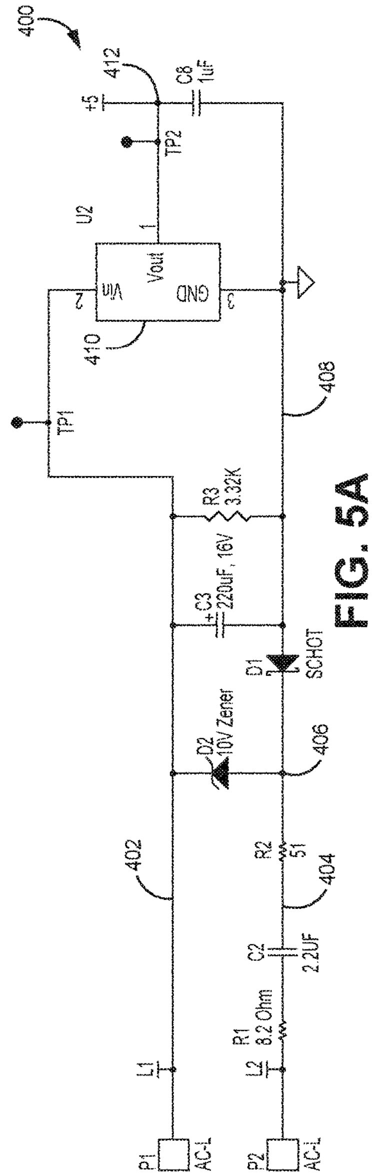
FIG. 5A is a schematic diagram of a capacitive power supply conversion portion of a pump control circuit of one embodiment of the present invention.
Figure 5B:
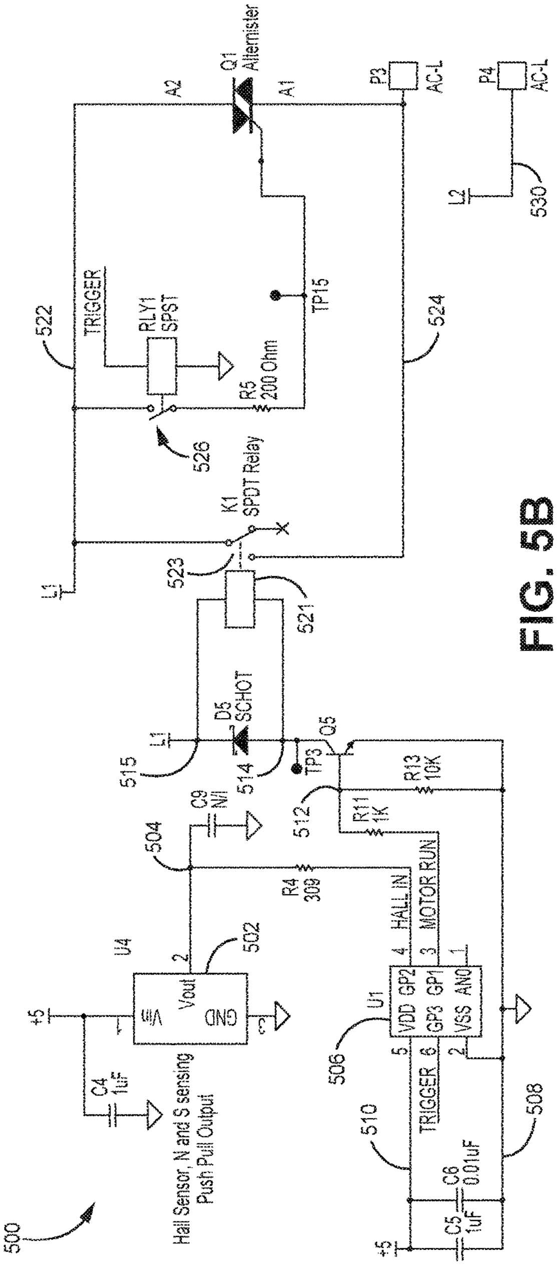
FIG. 5B is a schematic diagram of a portion of the pump control circuit of one embodiment of the present invention.

FIGS. 5A and 5B illustrate schematic diagrams of an example pump control circuit of an embodiment. In particular, FIG. 5A illustrates a capacitive power supply conversion section 400 of the circuit that converts 120V alternating current (AC) to 5V direct current (DC) to operate the controller 502 and sensor 506. The AC current is applied across inputs P1 and P2. Input rail 402 electrically couples P1 to a Vin port of a 5V regulator 410. Coupled in series to input P2 are resistor R1, Capacitor C2, and resistor R2. Resistor R2 is in turn coupled to node 406. Coupled across input rail 402 and node 406 is diode D2. Diode D1 is further coupled across node 406 and a ground rail 408. Capacitor C3 and resistor R3 are each coupled across input rail 402 and ground rail 408. Ground rail 408 is coupled to a ground input of regulator 410. An output of the regulator 410 is coupled to node 412. Finally, capacitor C8 is coupled across node 412 and ground rail 408.

FIG. 5B illustrates the control circuit 500 in an embodiment. The control circuit 500 in this embodiment includes Hall effect sensor 502. A power input port Vin of the Hall effect sensor 502 is coupled to node 412 to receive the 5V output of the power supply conversion section 400 of the circuit. Further coupled between the input port Vin of the Hall effect sensor 502 and ground is capacitor C4. A ground port GND of the Hall effect sensor 502 is further coupled to ground. An output port of the Hall effect sensor 502 is coupled to node 504. Capacitor C9 is coupled between node 504 and ground. The control circuit 500 also includes controller 506. A power input port 5 of the controller 506 is coupled to node 412 via rail 510 to receive the 5V output by the power supply conversion section 400 of the circuit. The controller 506 further includes a hall in port 4 to receive the upper fluid level detect signal. A resistor R4 is coupled between node 504 and hall in port 4 of the controller 506. The controller 506 in this embodiment further has a trigger port 6 that is coupled to trigger relay RLY1 further discussed below. A ground port 2 of the controller 506 is coupled to ground via ground rail 508. Finally, the controller 506 includes a motor run port 3. Coupled across rail 510 and ground rail 508 are capacitors C5 and C6. The control circuit 500 further includes a transistor Q5 used to operate the motor. A base of the transistor Q5 is coupled to node 512. Resistor R11 is coupled between node 512 and motor port 3 of the controller 506. Resistor R13 is coupled between node 512 and ground rail 508. The emitter of transistor Q5 is coupled to ground rail 508. The collector of transistor Q5 is coupled to node 514.

The control circuit 500 in this example embodiment includes relay K1 which in one embodiment is a mechanical relay. In other embodiments, a solid state relay could be used. Relay K1 includes a coil portion designated as 521 and a switch portion designated as 523 that switches based on an electrical field generated by the coil portion 521. A first side of the coil portion 521 is coupled to node 514. A second side of the coil portion 521 is coupled to node 515. Node 515 is further coupled to L1 that in turn is coupled to input P1 via input rail 402. Further diode D5 is coupled across node 514 and 515. Relay K1 is coupled in parallel with solid state triac Q1 across rails 522 and rail 524. Connection L1 couples rail 1 to input P1 via input rail 402. A triac relay RLY1 is used to activate triac Q1. The triac relay RLY1, includes an activation port that is coupled to trigger port 6 of the controller 506. The triac relay RLY1 further includes a ground port that is coupled to ground. The controller 506 activates the triac relay RLY1 with a trigger signal which closes a switch 526. Closing the switch 526 of the relay RLY1 connects rail 522 to the gate of triac Q1 which in turn activate the triac Q1 to pass current. A resistor R5 is coupled between switch 526 and the gate of the triac Q1. Also illustrated in FIG. 5 is rail 530 that couples terminal P4 to a pump motor (not shown). Connection L2 on rail 530 is coupled to input P2. The pump motor is also coupled to terminal P3 which is coupled to rail 524. Hence, the pump motor is coupled across P3 and P4 to selectively receive the 120V AC current for operation.

In particular, in operation the controller selectively activates RLY1 first to allow current to flow to the motor via triac Q1 based on an upper fluid level detect signal received from the Hall effect sensor 502. After a select amount of time has passed, the controller 506 activates transistor Q5 via motor run port 3 which in turn activates relay K1. Activation of relay K1 couples current from L1 to rail 524 and P3. Because current was already being applied across P3 via the path through the triac Q1, arcing that would normally occur because of the sudden start of motor current is prevented. The controller 506 then shuts off the triac Q1 so heat is not generated by the triac Q1 by current passing through the triac Q1 while the relay K1 is providing a current path to the motor. When the upper fluid level detect signal is no longer being received by the controller 506, the controller 506 reactivates the triac Q1 via activating relay RLY1 with a trigger signal. After a period of time, relay K1 is turned off. Arcing that would normally be present because of the collapsing of the electric field in relay K1 is not present because of the current path provided by the triac Q1. After a select period of time, the controller 506 turns the triac Q1 off which stops the pump and the cycle is complete.

Figure 6:
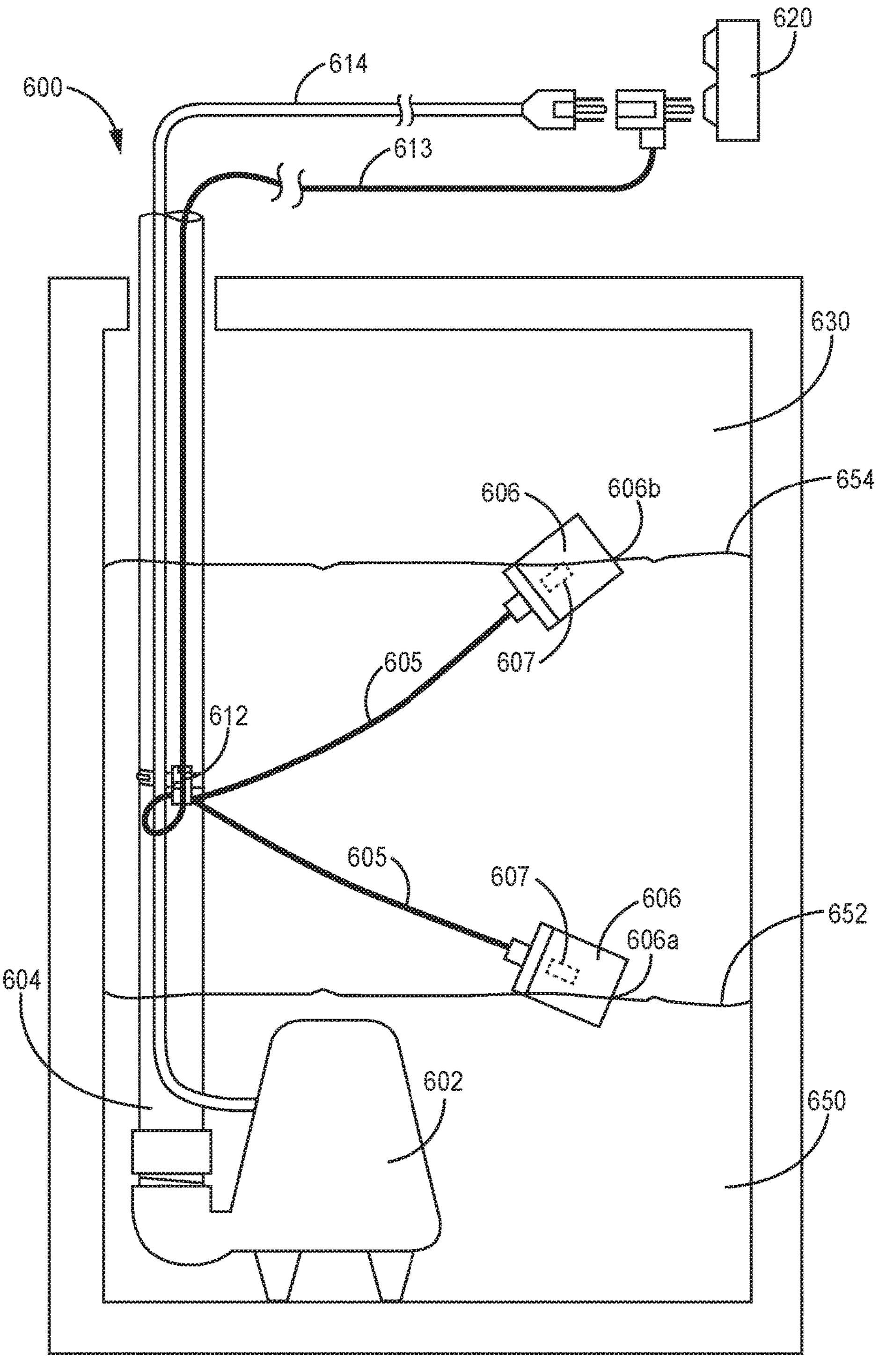
FIG. 6 is a side view of another pump system implementing a pump switching device of another embodiment of the present invention.

FIG. 6 provides yet another embodiment. As discussed above, different types of sensors besides Hall effect sensors could be used in embodiments of the present invention. In FIG. 6, a side view of another pump system 600 that implements the pump switching device, such as pump switching device 100 discussed above, with a tilt sensor arrangement is illustrated. As illustrated, this embodiment includes the pump system 600 received in a cavity 630 that contains a fluid 650 to be pumped out. The pump system 600 includes a pump 602 that is in fluid communication with a discharge tube 604. The pump 602 receives power for operations from a power source 620 via power cord 614. The pump system 600 includes a control housing 612 that houses components that make up the pump switching device such as switch device 100 discussed above. The pump system 600 further includes a float 606 that is tethered to a portion of the pump system 600 via connection member 605. Inside the float 606 is a tilt sensor 607 that is in communication with a controller in the pump switching device. In this embodiment, the tilt sensor 607 is designed to send the upper fluid level detect signal once the tilt sensor has reached a select tilt orientation. FIG. 6 illustrates a lower fluid level 652 and a lower float position 606*a* of the float 606 at the lower fluid level 652. FIG. 6 also illustrates an upper fluid level 654 and an upper float position 606*b* of the float 606 at the upper fluid level 654. As illustrated, the tilt sensor 607 at the upper float position 606*b* of the float 606 is tilted in a different orientation than the tilt sensor 607 at the lower float position 606*a* of the float 606. In an embodiment, the tilt sensor 607 is designed to send the upper fluid level detect signal until the float 606 once again reaches the lower float positioned 606*a*. Hence, other types of sensors can be used in embodiments of the present invention.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A pump switching device comprising:

a relay to selectively couple current to a pump motor;

a switch coupled in parallel with the relay;

a magnet to generate a magnetic field;

a Hall effect sensor configured to generate a signal upon the detection of the magnetic field;

a float configured and arranged to float on a fluid, the float operationally coupled to the magnet;

a latch configured to selectively hold the magnet in detection range of the Hall effect sensor until a fluid level is a select distance from the Hall effect sensor, in which the latch is a metallic member attracted to the magnetic field of the magnet; and a controller in communication with the sensor, the controller further coupled to control the relay and the switch, the controller configured to activate the switch a select amount of time before the controller activates the relay upon initial detection of the signal from the sensor, the controller further configured to deactivate the switch a select amount of time after the relay is activated while the signal is being detected.

2. The pump switching device of claim 1, further comprising:

the controller further configured to activate the switch a select amount of time before deactivating the relay when the signal from the sensor is no longer detected, the controller further configured to deactivate the switch a select amount of time after deactivating the relay.

3. The pump switching device of claim 1, wherein the relay is a solid state relay.

4. The pump switching device of claim 1, wherein the switch is a triac.

5. The pump switching device of claim 4, further comprising:

a triac relay coupled to activate a gate of the triac, the triac relay controlled by the controller.

6. A pump switching device comprising:

a relay to selectively couple current to a pump motor;

a switch coupled in parallel with the relay;

a Hall effect sensor configured to generate a signal upon the detection of a magnetic field;

a magnet to generate the magnetic field a controller in communication with the sensor, the controller further coupled to control the relay and the switch;

a float configured and arranged to interact with a fluid, the float operationally coupled to the magnet;

a float rod upon which the float is slidably mounted;

an activation member coupled to the float rod;

a magnet coupled to the activation member, the float configured and arranged to selectively hold the activation member to move the activation member and magnet towards the Hall effect sensor; and a latch to selectively hold the magnet in detection range of until a level of the fluid has been reduced to a predetermined lower level, in which the latch is a metallic member attracted to the magnetic field of the magnet.

7. The pump switching device of claim 6, wherein the controller is configured to activate the switch a select amount of time before the controller activates the relay upon initial detection of the signal from the sensor, the controller further configured to deactivate the switch a select amount of time after the relay is activated while the signal is being detected.

8. The pump switching device of claim 7, wherein the controller is further configured to activate the switch when the signal from the sensor is no longer detected, the controller is further configured to deactivate the relay once the switch has been activated, the controller further configured to deactivate the switch after the relay has been deactivated.

* * * * *